(12) United States Patent
Murata

(10) Patent No.: US 7,675,323 B2
(45) Date of Patent: Mar. 9, 2010

(54) DIFFERENTIAL SIGNAL RECEIVER

(75) Inventor: Toshikazu Murata, Kanagawa (JP)

(73) Assignee: NEC Electronics Corporation, Kawasaki, Kanagawa (JP)

(*) Notice: Subject to any disclaimer, the term of this patent is extended or adjusted under 35 U.S.C. 154(b) by 0 days.

(21) Appl. No.: 11/656,533

(22) Filed: Jan. 23, 2007

(65) Prior Publication Data
US 2007/0188230 A1 Aug. 16, 2007

(30) Foreign Application Priority Data
Jan. 27, 2006 (JP) .............................. 2006-018842

(51) Int. Cl.
*H03K 19/0175* (2006.01)
(52) U.S. Cl. .......................... 326/82; 326/86; 327/109
(58) Field of Classification Search .................. 326/68, 326/82–83, 86; 327/108–109
See application file for complete search history.

(56) References Cited

U.S. PATENT DOCUMENTS

| | | | | |
|---|---|---|---|---|
| 4,918,336 A | * | 4/1990 | Graham et al. .............. | 326/117 |
| 6,392,452 B2 | * | 5/2002 | Lee ............................ | 327/108 |
| 6,943,585 B2 | * | 9/2005 | Lee et al. ...................... | 326/58 |
| 7,279,934 B2 | * | 10/2007 | Do .............................. | 326/83 |
| 7,446,576 B2 | * | 11/2008 | Fiedler ....................... | 327/108 |
| 2004/0246026 A1 | * | 12/2004 | Wang et al. .................. | 326/86 |

FOREIGN PATENT DOCUMENTS

JP 2003-198265 7/2003

* cited by examiner

*Primary Examiner*—Vibol Tan
*Assistant Examiner*—Jason Crawford
(74) *Attorney, Agent, or Firm*—McGInn IP Law Group, PLLC (57) ABSTRACT

A differential signal receiver according to the present invention includes a waveform shaping circuit selectively outputting an upper limit value having a first potential difference from a first power supply potential, and a lower limit value having a second potential difference from the upper limit value, from a first and a second output terminals according to a differential signal input, and an amplifier comparing voltages of the first and the second output terminals and outputting one of a voltage almost the same as the first power supply potential or a voltage almost the same as a second power supply potential.

4 Claims, 9 Drawing Sheets

DIFFERENTIAL SIGNAL RECEIVER

BACKGROUND OF THE INVENTION

1. Field of the Invention

The present invention relates to a differential signal receiver, and particularly to a differential signal receiver used to receive a small-amplitude differential clock signal and a differential data signal.

2. Description of Related Art

Thin and low-power consumption flat panel displays are mainstream for PCs (personal computers) and television monitors. Liquid crystal display panels, which are a main format of the flat panel display, are rapidly advancing to be developed, and the numbers of display devices and effective pixels are desired to increase. Liquid display panels display a screen by converting digital signal data being input into analog voltage to apply it to liquid crystal devices. With an increasing number of pixels and effective pixels, the input digital signal data needs to be transferred faster. Accordingly the data transfer is carried out by data transfer standards using a small-amplitude differential signal such as RSDS (Reduced Swing Differential Signaling) and miniLVDS (Low Voltage Differential Signaling). Therefore, in a display driver for processing data, a receiver is required for converting an amplitude of a small signal differential signal data being input into an internal logic voltage.

Figure 5:
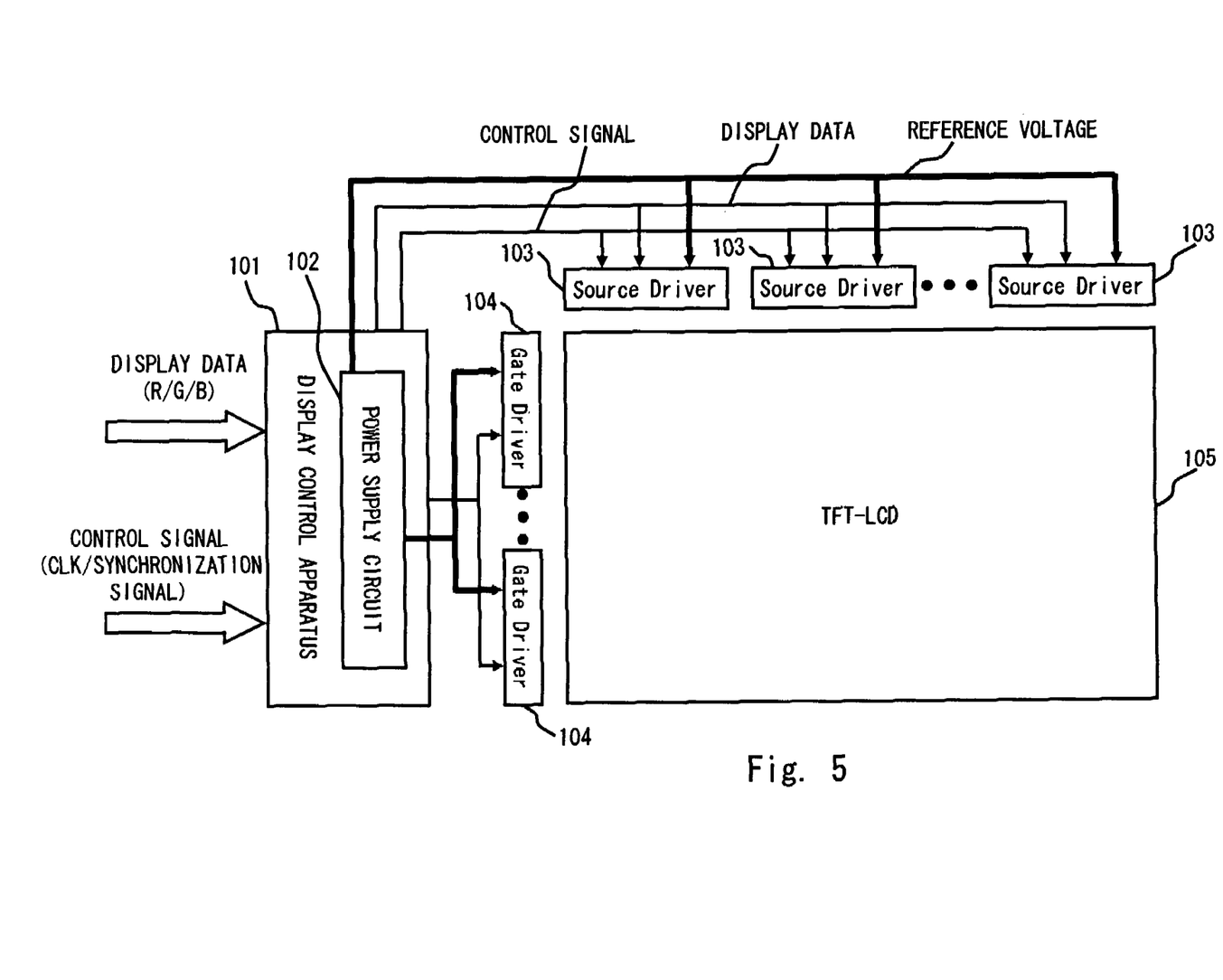
FIG. 5 is a block diagram showing a general liquid crystal panel.

A block diagram of a general liquid crystal panel is shown in FIG. 5. The liquid crystal display panel includes a display control apparatus 101, a power supply circuit 102, a source driver 103, a gate driver 104, and a TFT-LCD (Thin Film Transistor-Liquid Crystal Display) 105. The display control apparatus 101 supplies display data being input and a control signal to the source driver 103 and the gate driver 104. The power supply circuit 102 is housed in the display control apparatus 101 to supply a reference voltage to the source driver 103 and the gate driver.

The source driver 103 controls pixel lines in columns of the TFT-LCD according to the display data and the control signal. The gate driver 104 controls pixel lines in rows of the TFT-LCD according to the control signal. The TFT-LCD 105 is a liquid crystal panel with pixels arranged in matrix to display an image.

Figure 6:
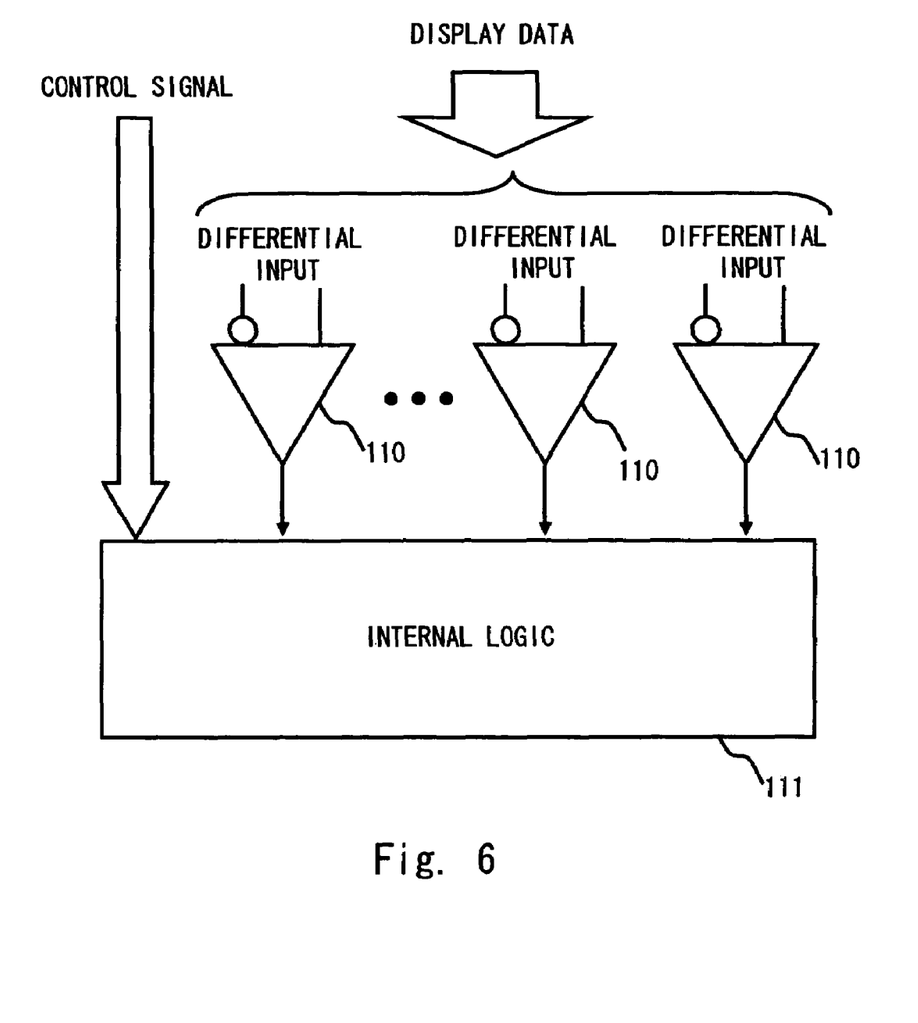
FIG. 6 is a block diagram showing a general source driver.

An internal block diagram of the source driver 103 that receives the display data is shown in FIG. 6. The display data is data indicating color information, for example. The display data is transferred by a small amplitude differential signal. The source driver 103 receives the display data with the receiver 110 and converts a differential signal into a single-end signal. The single-end signal and the control signal are converted from digital to analog signals in an internal logical circuit 111.

Further, a voltage and an amplitude for the display data fluctuates due to a fluctuation in production tolerance, reflection, and noise in a transmission. This causes the signal output from the receiver to fluctuate delay time and deteriorate a duty ratio indicating a ratio of high and low levels in a waveform. A receiver to improve this fluctuation is disclosed in Japanese Unexamined Patent Application Publication No. 2003-198265 (first conventional technique).

Figure 7:
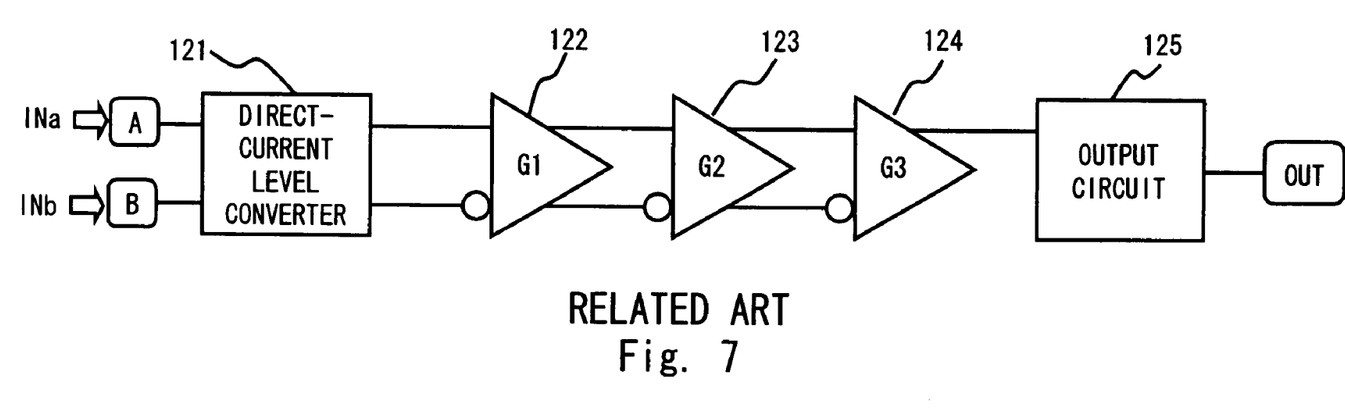
FIG. 7 is a block diagram showing a differential signal amplifier according to a first conventional technique.

A block diagram of the receiver according to the first conventional technique is shown in FIG. 7. The receiver of the first conventional technique level shifts a direct-current level of a differential signal received via input terminals A and B in a direct-current level converter 121, amplifies it by a first stage amplifier 122 (gain G1), a second stage amplifier 123 (gain G2), and a third stage amplifier 124 (gain G3), converts the differential signal to a single-end signal in the third stage amplifier, and then outputs the single-end signal from an output circuit. A detailed circuit diagram of the receiver is shown in FIG. 8.

Figure 8:
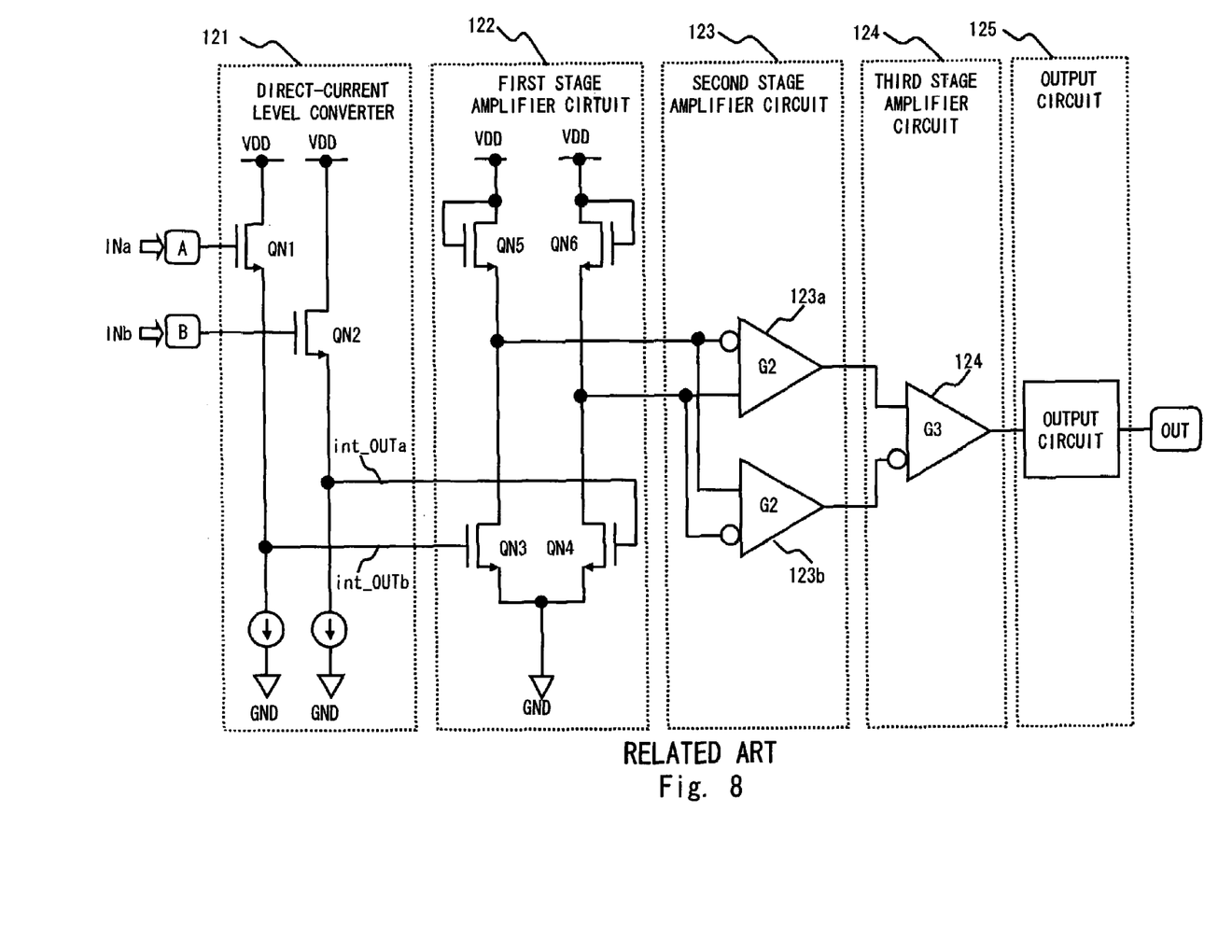
FIG. 8 is a circuit diagram showing a differential signal amplifier according to the first conventional technique.
Figure 9A:
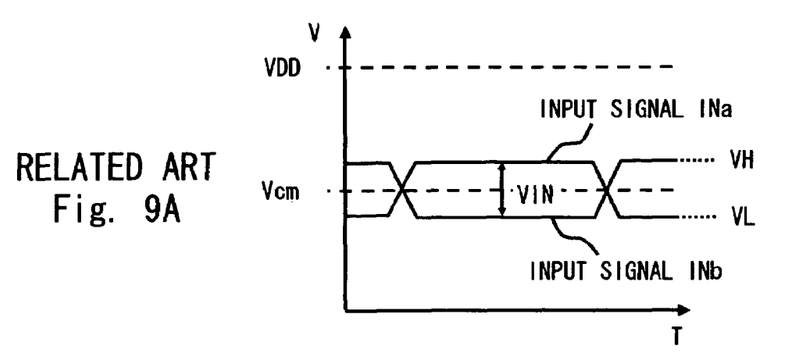
FIG. 9A is a view showing a waveform of an input signal according to the first conventional technique.
Figure 9B:
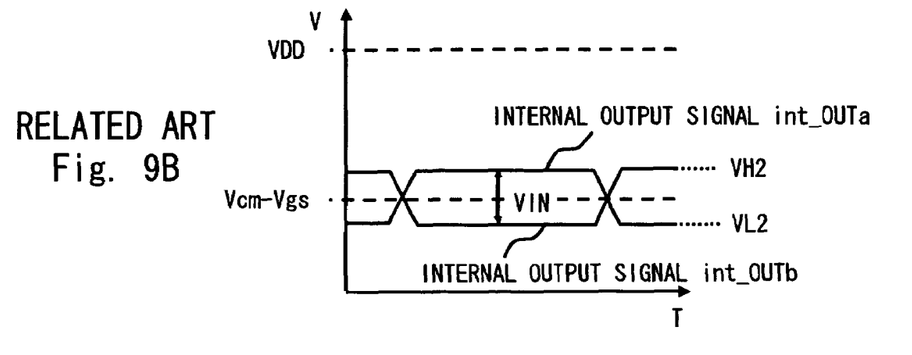
FIG. 9B is a view showing a waveform of an internal output terminal according to the first conventional technique.

As shown in FIG. 8, a direct-current level converter 121 includes NMOS transistors QN1 and QN2 connected to input terminals A and B respectively. Drains of the NMOS transistors QN1 and QN2 are connected to a power supply potential VDD, and current sources I1 and I2 are connected between sources and ground potential GND. The sources of the NMOS transistor QN1 and QN2 output internal output signals int_OUTa and int_OUTb corresponding to differential signals INa and INb input respectively input from the input terminals A and B. Direct-current levels of the internal output signals int_OUTa and int_OUTb are values of a direct-current level Vcm of the differential signals INa and INb subtracting a threshold voltage Vgs. A signal waveform of an input signal is shown in FIG. 9A, and a signal waveform of an output signal from the direct-current level converter 121 is shown in FIG. 9B. As shown in FIGS. 9A and 9B, the differential signals INa and INb are signals with a center at the direct-current level Vcm, a high level voltage at VH, a low level voltage at VL, where an amplitude VIN indicated with a voltage difference between VH and VL. Further, the internal output signals int_OUTa and int_OUTb that are output from the direct-current level converter 121 have amplitudes of VIN with a center at the current level Vcm−Vgs.

The first stage amplifier 122 includes NMOS transistors QN3 to QN6. Sources of the NMOS transistors QN3 and QN4 are connected in common, and connected to the ground potential GND. Further the NMOS transistors QN5 and QN6 are diode connected, and are connected between drains of the NMOS transistors QN3 and QN4, and the power supply potential VDD. A gate of the NMOS transistor QN3 is connected to the source of the NMOS transistor QN1, and receives one output signal output from the direct-current level converter 121. A gate of the NMOS transistor QN4 is connected to the source of the NMOS transistor QN2, and receives another output signal output from the direct-current level converter 121. NMOS transistors QN3 and QN4 switch to be conductive or nonconductive according to a signal input to the gates, amplify the signals input from their drains to the gates, and output the signals.

The second stage amplifier 123 includes an amplifier 123a for amplifying an output from the NMOS transistor QN4 and an amplifier 123b for amplifying an output from the NMOS transistor QN3. The second stage amplifier 123 amplifies each signal by the gain G2. The third stage amplifier 124 includes an amplifier 124b, amplifies the signals output from the amplifiers 123a and 123b, and converts the signals into single-end signals to output the signals. An output circuit 125 controls whether to output the signals output the signals output from the amplifier 124 to an output terminal OUT.

The receiver according to the first conventional technique is able to reduce delay time of the signals in the receiver by amplifying the signals by the plural stages of amplifiers, even if the amplitude of the differential signals fluctuate.

However in the receiver of the first conventional technique, if the direct-current level Vcm of the input signal shifts to a side of the power supply voltage VDD or the amplitude VIN of the input signal enlarges, an amount of the current flowing to the NMOS transistor QN3 or QN4 increases, thereby increasing the threshold voltage Vgs of the NMOS transistor QN5 and QN6 and also reducing the delay time of the receiver.

On the other hand if the direct-current level Vcm of the input signal shifts to a side of the ground potential GND or the amplitude VIN of the input signal reduces, an amount of the current flowing to the NMOS transistor QN3 or QN4 decreases, thereby decreasing the threshold voltage Vgs of the NMOS transistor QN5 and QN6 and also increasing the delay time of the receiver.

Further, with a lower limit of an input range of the direct-current level Vcm of the input signal indicated by Vlimit, in order for the receiver to operate, it must be Vlimit1>Vgs (QN1)+Vgs(QN3)−(VIN/2). In case Vgs=1V and VIN=200 mV, Vlimit>(1+1−(0.2/2))=1.9V. Thus the receiver is not able to operate with the direct-current level Vcm having the input signal lower or equal to 1.9V.

Accordingly in the receiver according to the first conventional technique, it has now been discovered that if the amplitude of the input signal or the direct-current level fluctuates, the delay time of the signal also fluctuates. Further, there is another problem that if the direct-current level of the input signal falls below the lower limit of the input range of the direct-current level of the input signal, the receiver does not operate.

SUMMARY OF THE INVENTION

According to the present invention, there is provided a differential signal receiver that includes a waveform shaping circuit selectively outputting an upper limit value having a first potential difference from a first power supply potential, and a lower limit value having a second potential difference from the upper limit value, from a first and a second output terminals according to a differential signal input, and an amplifier comparing voltages of the first and the second output terminals and outputting one of a voltage almost the same as the first power supply potential or a voltage almost the same as a second power supply potential.

According to the differential signal receiver of the present invention, the upper limit value of the differential signal output from the waveform shaping circuit becomes the first power supply potential (for example the power supply potential VDD) and the first potential difference, with an amplitude being the second potential difference(for example the ground potential GND). Accordingly a direct-current level and the amplitude of the differential signal output from the waveform shaping circuit does not depend on the direct-current level and the amplitude input thereto. Further, the differential signal output from the waveform shaping circuit becomes stable that does not depend on a fluctuation of the input differential signal. Further, as the amplifier operates according to the output signal of the waveform shaping circuit having a stable direct-current level and an amplitude, a stable single end signal can be output.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Embodiments of the present invention are described hereinafter with reference to the drawings. A differential signal receiver 1 inputs a small-amplitude differential signal and outputs a large-amplitude single-end signal. An amplitude of the input differential signal is approximately 0.2V(low level: 0.8V and high level:1.0V) or 0.6V(low level:0.2V and high level:0.8V). Furthermore, the single-end signal being output has an amplitude of a potential difference-between a first power supply (for example a power supply potential VDD) and a second power supply potential (for example a ground potential GND). A circuit diagram of the differential signal receiver 1 according to a first embodiment is shown in FIG. 1.

Figure 1:
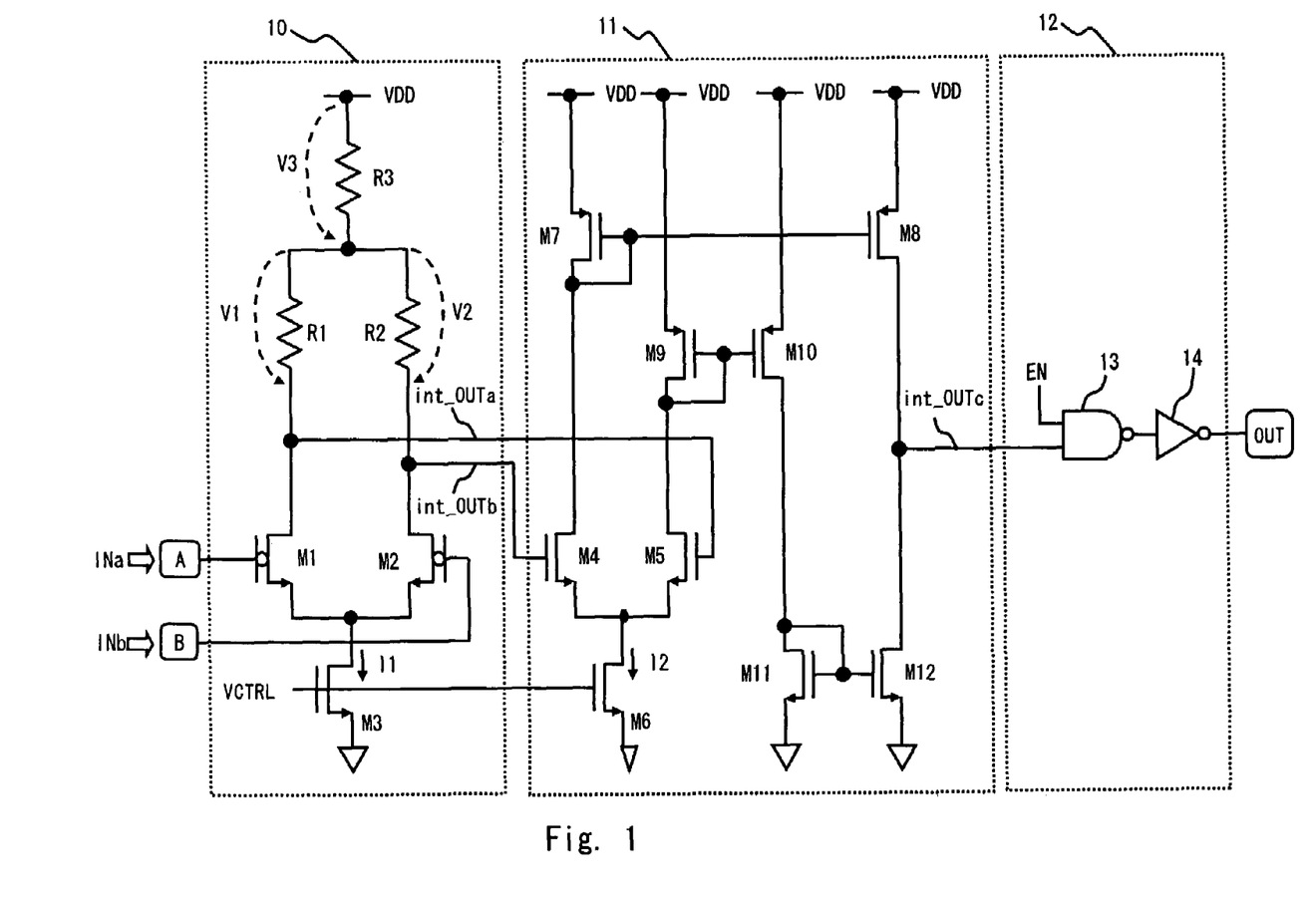
FIG. 1 is a circuit diagram showing a differential signal amplifier according to a first embodiment of the present invention.

As shown in FIG. 1, the differential signal receiver 1 includes a waveform shaping circuit 10, an amplifier 11, and an output control circuit 12. The waveform shaping circuit 10 outputs a signal from a first output terminal according to the input differential signal, the signal having an upper limit is the power supply potential VDD subtracting a first potential difference, and a lower limit is the upper limit subtracting the second differential potential. The waveform shaping circuit 10 also outputs a signal from the second output terminal, the signal having an upper and a lower limit almost the same as the signal output from the first output terminal. The amplifier 11 compares a voltage of the first and the second output terminals, and outputs a single-end signal having an amplitude almost the same as the potential difference between the power supply potential VDD and the ground potential GND. The output control circuit 12 controls whether to transfer the output from the amplifier 11 or to output the ground potential GND. The circuits are described in detail hereinafter.

The waveform shaping circuit 10 includes a first, second, and third transistors, a first potential differential setting device, and a plurality of second potential difference set devices. In this embodiment, Nch depletion type transistors M1 and M2 are used for the first and the second transistors. The depletion type transistors M1 and M2 are preferably non-doped type transistors. An Nch enhancement type transistor M3 is used for the third transistor. A resistance R3 is used for the first potential difference setting device. Resistances R1 and R2 are used for the second potential difference setting device. Preferably, resistance values of the resistances R1 and R2 are substantially same.

An input terminal A is connected to a gate of the Nch depletion type transistor M1. An input terminal B is connected to a gate of the Nch depletion type transistor M2. The Nch depletion type transistors M1 and M2 form a differential pair with sources connected in common. A common connection point of the sources is connected to a drain of the Nch enhancement type transistor M3. A source of the Nch enhancement type transistor is connected to a ground potential GND. A current control signal VCTRL is connected to a gate of the Nch enhancement type transistor M3. The Nch enhancement type transistor M3 outputs a current I1 according to a voltage value of the current control signal VCTRL.

One terminal of the resistance R1 is connected to a drain of the Nch depletion type transistor M1. For the Nch depletion type transistor M1, this connection point becomes the first output terminal according to an input signal input to the input terminal A, and outputs a first output signal (for example an internal output signal int_OUTa). One terminal of the resistance R2 is connected to a drain of the Nch depletion type transistor M2. This connection point is the second output terminal. The Nch depletion type transistor M2 outputs a second output signal (for example an internal output signal int_OUTb) from the second output terminal according to an input signal input to the input terminal B. Another terminal of the resistance R1 and another terminal of the resistance R2 are connected in common. The resistance R3 is connected between the common connection point and the power supply potential VDD.

The amplifier 11 includes Nch enhancement type transistors M4, M5, M6, M11, and M12, and Pch enhancement type transistors M7 to M9. The internal output terminal int_OUTa is input to a gate of the Nch enhancement type transistor M5. The internal output terminal int_OUTb is input to a gate of the N type CMOS transistor M4. The Nch enhancement type transistors M4 and M5 form a differential pair in which their sources are connected in common. The common connection point of the sources is connected to the ground potential GND. The current control signal VCTRL is connected to a gate of the Nch enhancement type transistor M6. The Nch enhancement type transistor M6 outputs a current I2 according to a voltage value of the current control signal VCTRL.

The Pch enhancement type transistors M7 and M8 form a current mirror circuit. Sources of the Pch enhancement type transistors M7 and M8 are connected to the power supply voltage VDD. The source of the Pch enhancement type transistor M7 is connected to a drain of the Nch enhancement type transistor M4. Gates of the Pch enhancement type transistors M7 and M8 are connected to each other, and also connected to the source of the Pch enhancement type transistor M7.

The Pch enhancement type transistors M9 and M10 form a current mirror circuit. Sources of the Pch enhancement type transistors M9 and M10 are connected to the power supply voltage VDD. The source of the Pch enhancement type transistor M9 is connected to a drain of the Nch enhancement type transistor M5. Gates of the Pch enhancement type transistors M9 and M10 are connected to each other, and also connected to the source of the Pch enhancement type transistor M9.

The Nch enhancement type transistors M11 and M12 form current mirror circuits. Sources of the Nch enhancement type transistors M11 and M12 are connected to the ground potential GND. The source of the Nch enhancement type transistor M11 is connected to a drain of the Nch enhancement type transistor M10. Gates of the Nch enhancement type transistors M11 and M12 are connected to each other, and also connected to the source of the Nch enhancement type transistor M11. Further, a drain of the Nch enhancement type transistor M12 is connected to a drain of the Nch enhancement type transistor M8. A third output signal (for example an internal output signal int_OUTc) is output from this connection point.

The output control circuit 12 includes an NAND circuit 13 and an inverter circuit 14. An output control signal EN is input to one terminal of the NAND circuit 13, and the internal output signal int_OUTc is input to another terminal. An output from the NAND circuit 13 is input to the inverter circuit 14, and an output from the inverter circuit 14 is connected to an output terminal OUT.

Figure 2A:
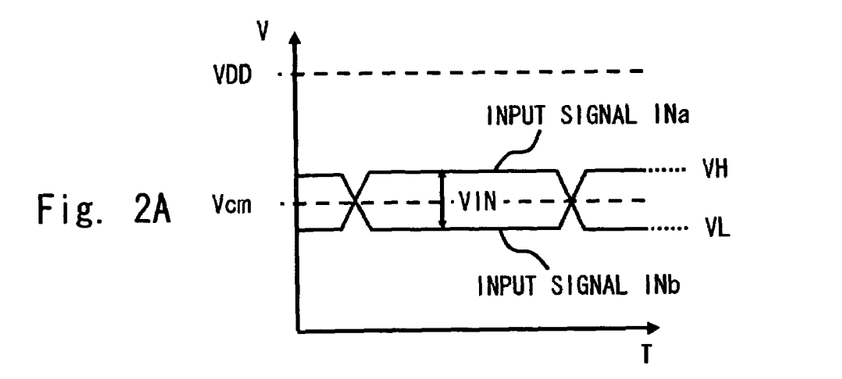
FIG. 2A is a view showing a waveform of an input signal according to the first embodiment of the present invention.

An operation of the differential signal receiver 1 of the first embodiment is described hereinafter in detail. Waveforms of differential signals INa and INb that are input to the differential signal receiver 1 are shown in FIG. 2A. As shown in FIG. 2A, the differential signals INa and INb are clock signals inverted to each other. A high level voltage of the differential signal is referred to as VH, a low level voltage is referred to as VL, and a direct-current level is referred to as Vcm.

A case in which a signal level of the differential signal INa that is input to the input terminal A is the high level voltage VH, and a signal level of the differential signal INb that is input to the input terminal B is the low level voltage VL is described hereinafter in detail. In this case, the Nch depletion type transistor M1 becomes conductive, and the Nch depletion type transistor M2 becomes nonconductive. Accordingly the current I1 flows to the Nch depletion type transistor M1. This causes to generate a voltage drop V3, which is V3=R3×I1, at both ends of the resistance R3. At both ends of the resistance R1, a voltage drop V1, which is V1=R1×I1, is generated by the resistance R1 and the current I1. On the other hand for the resistance R2, no voltage drop is generated at both ends of the resistance R2 because the current I1 does not flow therein. Accordingly a signal level Vint_OUTa of the internal output signal int_OUTa can is Vint_OUTa=VDD−V3−V1. Further, a signal level Vint_OUTb of the internal output signal int_OUTb can be expressed as Vint_OUTb=VDD−V3.

A case in which a signal level of the differential signal INa that is input to the input terminal A is the low level voltage VL, and a signal level of the differential signal INb that is input to the input terminal B is the high level voltage VH is described hereinafter in detail. In this case the Nch depletion type transistor M1 becomes nonconductive and the Nch depletion type transistor M2 becomes conductive. Accordingly the current I1 flows to the Nch depletion type transistor M2. This causes to generate the voltage drop V3, which is V3=R3×I1, at both ends of the resistance R3. Further, at both ends of the resistance R2, a voltage drop V2, which is V2=R2×I1, is generated by the resistance R2 and the current I1. On the other hand for the resistance R1, no voltage drop is generated at both ends of the resistance R1 because the current I1 does not flow therein. Accordingly the signal level Vint_OUTa of the internal output signal int_OUTa can be expressed as Vint_OUTa=VDD−V3. Further, the signal level Vint_OUTb of the internal output signal int_OUTb can be expressed as Vint_OUTb=VDD−V3−V2. If resistance values of the resistances R1 and R2 are almost the same, the voltages V1 and V2 become substantially same voltages. Therefore, the signal level int_OUTb of the internal output signal int_OUTb can be expressed as Vint_OUTb=VDD−V3−V1.

Figure 2B:
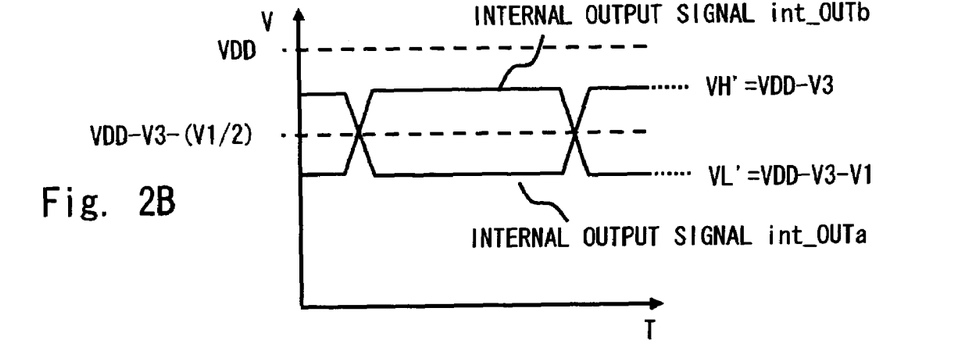
FIG. 2B is a view showing a waveform of an internal output signal according to the first embodiment of the present invention.

Therefore, the waveform shaping circuit 10 has a high level voltage VH'=VDD−V3 and a low level voltage VL'=VDD−V3−V1 according to the input differential signals INa and INb, outputting the internal output signals int_OUTa and int_OUTb that operates in differential. A direct-current level Vcm' of the internal output signals int_OUTa and int_OUTb is Vcm'=VDD−V3−(V1/2). Waveform of the internal output signals shown in FIG. 2B.

The amplifier 11 outputs the single-end signal having an amplitude substantially same as the potential difference between the power supply potential VDD and the ground potential GND by comparing the internal output signals int_OUTa and int_OUTb, that are generated as described herein, and amplifying the signals.

If the internal output signal int_OUTa is larger than the internal output signal int_OUTb, in the amplifier 11, the Nch enhancement type transistor M5 becomes conductive and the Nch enhancement type transistor M4 becomes nonconductive. Accordingly the current I2 flows to the Nch enhancement type transistor M12 via the current mirror circuit formed by the Pch enhancement type transistors M9 and M10, and the current mirror circuit formed by the Nch enhancement type transistors M11 and M12. Thus the Nch enhancement type transistor M12 becomes conductive. On the other hand, as the current I2 does not flow to the Nch enhancement type transistor M4, the current mirror circuit formed by the Pch enhancement type transistors M7 and M8 does not pass a current. Thus the Pch enhancement type transistor M8 becomes nonconductive. Therefore, the signal level Vint_OUTc of the internal output signal int_OUTc in the amplifier 11 becomes almost the same as the ground potential GND.

If the internal output signal int_OUTa is smaller than the internal output signal int_OUTb, in the amplifier 11, the Nch enhancement type transistor M4 becomes conductive and the Nch enhancement type transistor M5 becomes nonconductive. Accordingly the current mirror circuit formed by the Pch enhancement type transistors M9 and M10 and the current mirror circuit formed by the Nch enhancement type transistors M11 and M12 does not pass a current. Thus the Nch enhancement type transistor M12 becomes nonconductive. On the other hand as the current I2 flows to the Nch enhancement type transistor M4, the current I2 flows to the P type MOS transistor M8 via the current mirror formed by the Pch enhancement type transistors M7 and M8. Thus the Pch enhancement type transistor M8 becomes conductive. Therefore, the signal level Vint_OUTc of the internal output signal int_OUTc of the amplifier 11 becomes almost the same as the power supply potential VDD.

The output control circuit 12 outputs the internal output signal int_OUTc via the NAND circuit 13 and the inverter circuit 14 with the output control signal EN being enabled. Further the output control circuit 12 inverts the voltage almost the same as the power supply potential VDD output from the NAND circuit 13 by the inverter circuit 14 with the output control signal EN being disabled.

As described in the foregoing, the waveform shaping circuit 10 of this embodiment includes a direct-current level set by the power supply voltage VDD, the resistances R1 to R3, and the current I1, regardless of the direct-current level Vcm of the differential signals INa and INb being input. Accordingly the direct-current level of the internal output signals int_OUTa and int_OUTb that are input to the amplifier 11 is not dependent on the direct-current level of the differential signals INa and INb that are input to the waveform shaping circuit 10.

Thus the operation of the amplifier 11 always has same conditions regardless of direct-current levels of the differential signals INa and INb that are input to the waveform shaping circuit 10. Accordingly delay time of the internal output signal Vint_OUTc that is output via the amplifier 11 becomes stable regardless of the direct-current levels of the differential signals INa and INb that are input to the waveform shaping circuit 10.

Further amplitudes of the internal output signals int_OUTa and int_OUTb of the waveform shaping circuit 10 is set by the resistance values of the resistances R1 and R2, and the current I1 that is supplied to the differential pair formed by the Nch depletion type transistor M1 and M2 as with the first embodiment. The Nch depletion type transistors M1 and M2 operate as switches according to the differential signal being input. Accordingly the amplitudes of the internal output signals int_OUTa and int_OUTb set by the current I1, and the resistances R1 and R2 do not fluctuate even if the direct-current level or the amplitude of the input differential signal fluctuates. Thus the delay time of the waveform shaping circuit 10 of the waveform shaping circuit 10 is stable. On the other hand in the receiver of the first conventional technique, the delay time fluctuates along with the fluctuation in the direct-current level of the differential signal input to the direct-current converter 121.

Further, the waveform shaping circuit 10 sets an upper and lower potential differences of the amplitudes by the current I1 that is output from one current source, thus a duty ratio of the internal output signals int_OUTa and int_OUTb can substantially be 50% (i.e. ratio of a high and a low level ratios is same). Further, a duty ratio of the internal output signal int_OUTc becomes substantially 50% because the amplifier 11 is able to operate according to the internal output signals int_OUTa and int_OUTb having the duty ratio of 50%.

As described in the foregoing, the differential signal receiver 1 of this embodiment is able to perform stably and with a high accuracy of the duty ratio.

On the other hand, as the waveform shaping circuit 10 of this embodiment receives the differential signals by the differential pair formed by the Nch depletion type transistors M1 and M2, the waveform shaping circuit 10 includes a wide input voltage range. For example, suppose VH of the differential signal input to the waveform shaping circuit 10 is 0.8V, VL is 1.0V, an amplitude is 200 mV, threshold voltage of the Nch depletion type transistors M1 and M2 Vgs=0V, and a saturation voltage of the Nch enhancement type transistors M1 and M2 Vdssat=0.2V, the direct-current level of the differential signal input to the waveform shaping circuit 10 is Vcm=Vgs+Vdssat=0.2V. On the other hand the direct-current level Vcm of the input signal to the receiver requires more than or equal to 1.9V.

Second Embodiment

Figure 3:
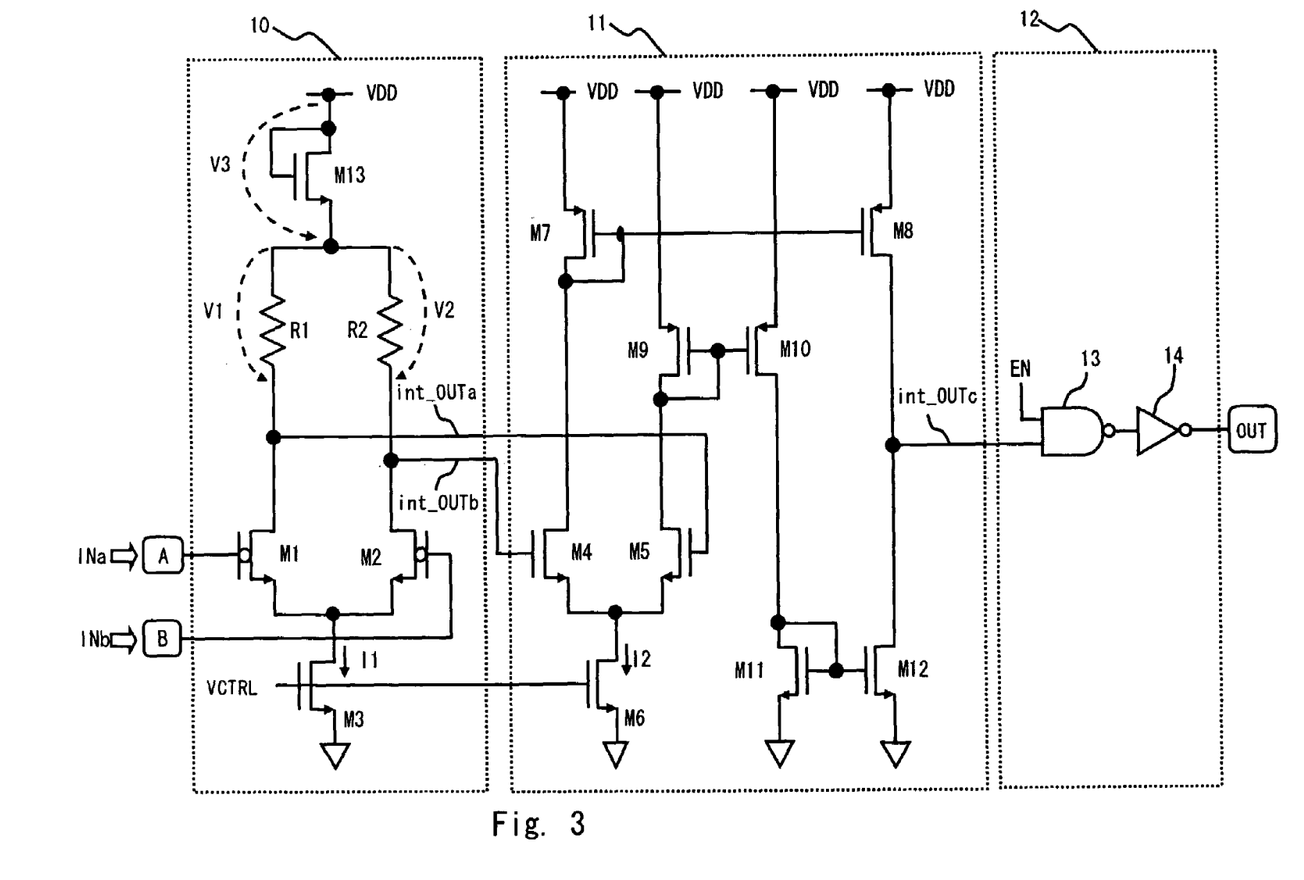
FIG. 3 is a circuit diagram showing a differential signal amplifier according to a second embodiment.

The differential signal receiver 1 uses the resistance R3 as the first potential difference setting device of the waveform shaping circuit 10. However for the first potential difference setting device of a waveform shaping circuit 20 according to a second embodiment, a diode connected Nch enhancement type transistor M13 is used. A circuit diagram of the second differential signal receiver 2 of the second embodiment is shown in FIG. 3. In FIG. 3, components identical to those in the first embodiment are denoted by reference numerals with detailed explanation omitted.

The waveform shaping 20 of the second embodiment includes an Nch enhancement type transistor M13 that is diode connected as the first potential difference setting device. The Nch enhancement type transistor M13 have a gate and a drain connected, and the drain is further connected to the power supply potential VDD. Further, a source of the Nch enhancement type transistor M13 is connected to the common connection point of the resistances R1 and R2.

When using the diode connected Nch enhancement type transistor M13 as the first potential setting device, a high level voltage VH' of the internal output signals int_OUTa and int_OUTb is VH'=VDD−Vgs[M13]. On the other hand, a low level voltage VL' of the internal output signals int_OUTa and int_OUTb is VL'=VDD−Vgs[13]−V1. The Vgs[M13] is a threshold voltage of the Nch enhancement type transistor M13. Further a direct-current level Vcm' of the internal output signals int_OUTa and int_OUTb is Vcm'=VDD−Vgs[M13]−(V1/2).

An amplitude of the internal output signals int_OUTa and int_OUTb of the waveform shaping circuit 20 is set by the resistance values of the resistances R1 and R2, and the current I1 that is supplied to the differential pair formed by the Nch depletion type transistor M1 and M2 as with the first embodiment. Further, the Nch depletion type transistors M1 and M2 of the waveform shaping circuit 20 of the second embodiment operate as switches according to the differential signal being input. However, even if the direct-current level or the amplitude of the differential signal being input fluctuates, a size of the current I1 flowing to the Nch enhancement type transistor M13 does not change. Accordingly the amplitudes of the internal output signals int_OUTa and int_OUTb set by the current I1 and the resistance R1 or R2 do not fluctuate. Thus the delay time of the waveform shaping circuit 20 is stable.

Further, by forming the first potential setting device with Nch enhancement type transistor, an area on a layout can be reduced as compared to a case of using resistances.

Third Embodiment

Figure 4:
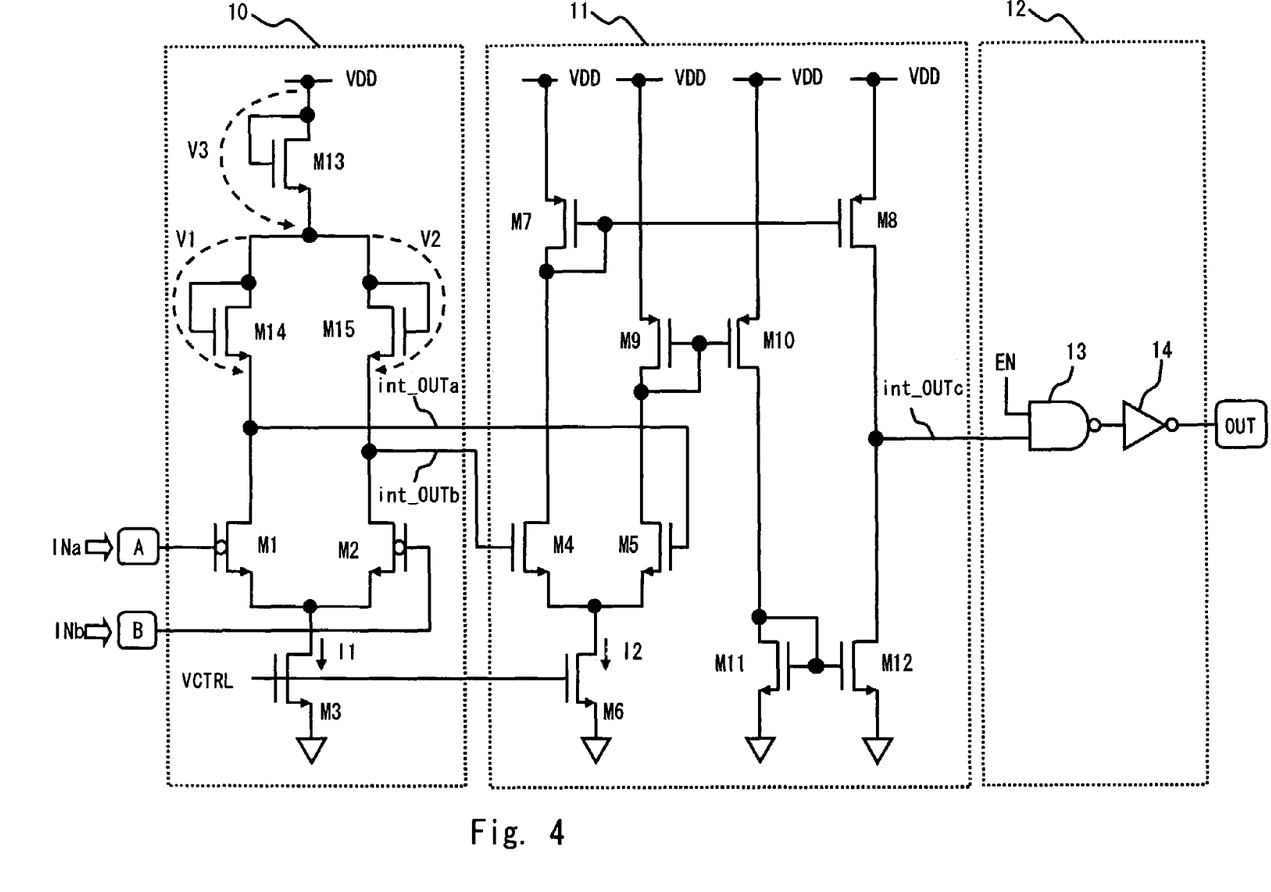
FIG. 4 is a circuit diagram showing a differential signal amplifier according to a third embodiment of the present invention.

In the differential signal receiver 1 of the second embodiment, the resistances R1 and R2 are used for the second potential differential setting device of the waveform shaping circuit 20. However diode connected Nch enhancement type transistors M14 and M15 are used for the second potential difference setting device of a waveform shaping circuit 30 in a differential signal receiver 3 of a third embodiment. The differential signal receiver 3 of the third embodiment is shown in FIG. 4. In FIG. 4, components identical to those in the second embodiment are denoted by reference numerals with detailed explanations omitted.

The waveform shaping circuit 30 of the third embodiment includes the diode connected Nch enhancement type transistors M14 and M15 used for the second potential difference setting device. The Nch enhancement type transistors M14 and M15 have gates and drains connected to each other. Further, the drains are connected in common, and is connected to a source of the Nch enhancement type transistor M13. A source of the Nch enhancement type transistor M14 is connected to the drain of the Nch depletion type transistor M1. A source of the Nch enhancement type transistor M15 is connected to the drain of the Nch depletion type transistor M2. The Nch enhancement type transistors M14 and M15 are preferably formed in same size. With the same transistor size and the same amount of current flowing to the transistor, threshold voltage also becomes same.

When using the diode connected Nch enhancement type transistors M14 and M15 for the second potential difference setting device, the high level voltage VH' of the internal output signals int_OUTa and int_OUTb is VH'=VDD−Vgs[M13]. On the other hand, the low level voltage VL' of the internal output signals int_OUTa and int_OUTb is VH'=VDD−Vgs[M13]−Vgs[M14]. Vgs[M14] is a threshold voltage of the Nch enhancement type transistor M14, which is substantially same as a threshold voltage Vgs[M15] of the Nch enhancement. Further, the direct-current level Vcm' of the internal output signals int_OUTa and int_OUTb is Vcm'=VDD−Vgs[M13]−(Vgs[M14]/2).

Amplitudes of the internal output signals int_OUTa and int_OUTb of the waveform shaping circuit 30 are set by the threshold voltage of the Nch enhancement type transistor M14 (or M15). The Nch depletion type transistors M1 and M2 of the waveform shaping circuit 30 of the third embodiment operate as switches according to the differential signal being input. However even if a direct-current level or the amplitude of the input differential signal fluctuates, a size of the current I1 flowing to the Nch enhancement type transistor M13 does not change. Accordingly the amplitudes of the internal output signals int_OUTa and int_OUTb set by the Nch enhancement type transistor M14 (or M15) do not fluctuate. Thus the delay time of the waveform shaping circuit 20 is stable.

By forming the second potential difference setting device with Nch enhancement type transistor, an area on a layout can be reduced as compared to a case of using resistances.

In the above embodiments, the first potential difference setting device maybe removed, and the upper limit value of the internal output signals output from the waveform shaping circuit may be the power supply potential. In the above embodiments, the differential pairs formed by Nch depletion type transistors are used, however the differential pairs may be formed by Pch depletion type transistors.

It is apparent that the present invention is not limited to the above embodiment and it may be modified and changed without departing from the scope and spirit of the invention.

What is claimed is:

1. A differential signal receiver, comprising:
   a waveform shaping circuit selectively outputting an upper limit value having a first potential difference from a first power supply potential, and a lower limit value having a second potential difference from the upper limit value, from a first and a second output terminals according to a differential signal input;
   an amplifier comparing voltages of the first and the second output terminals and outputting one of a voltage almost the same as the first power supply potential or a voltage almost the same as a second power supply potential;
   a first potential difference setting device for setting the first potential difference; and
   a second potential difference setting device for setting the second potential difference,
   wherein at least one of the first and the second potential difference setting devices comprises a diode connected transistor,
   wherein the amplifier comprises a first Nch enhancement type transistor and a second Nch enhancement type transistor, a source of the first Nch enhancement type transistor connected in common with a source of the second Nch enhancement type transistor,
   wherein a gate of the first Nch enhancement type transistor is connected with the first output terminal,
   wherein a gate of the second Nch enhancement type transistor is connected with the second output terminal,
   wherein the amplifier further comprises a first Pch enhancement type transistor, a second Pch enhancement type transistor, a third Pch enhancement type transistor, a fourth Pch enhancement type transistor, a third Nch enhancement type transistor, and a fourth Nch enhancement type transistor,
   wherein a gate of the first Pch enhancement type transistor is connected with a gate of the second Pch enhancement type transistor, wherein a gate of the third Pch enhancement type transistor is connected with a gate of the fourth Pch enhancement type transistor, wherein a gate of the third Nch enhancement type transistor is connected with a gate of the fourth Nch enhancement type transistor, wherein a source of the third Nch enhancement type transistor is connected with a drain of the fourth Pch enhancement type transistor, and wherein a drain of the fourth Nch enhancement type transistor is connected to a drain of the second Pch enhancement type transistor.

2. The differential signal receiver of claim 1, wherein the amplifier outputs a signal from the connection between the drain of the fourth Nch enhancement type transistor and the drain of the second Pch enhancement type transistor.

3. A differential signal receiver, comprising:

a waveform shaping circuit selectively outputting an upper limit value having a first potential difference from a first power supply potential, and a lower limit value having a second potential difference from the upper limit value, from a first and a second output terminals according to a differential signal input;

an amplifier comparing voltages of the first and the second output terminals and outputting one of a voltage almost the same as the first power supply potential or a voltage almost the same as a second power supply potential;

a first potential difference setting device for setting the first potential difference; and a second potential difference setting device for setting the second potential difference, wherein at least one of the first and the second potential difference setting devices comprises a diode connected transistor, wherein the amplifier comprises a first Nch enhancement type transistor and a second Nch enhancement type transistor, a source of the first Nch enhancement type transistor connected in common with a source of the second Nch enhancement type transistor, wherein a gate of the first Nch enhancement type transistor is connected with the first output terminal, wherein a gate of the second Nch enhancement type transistor is connected with the second output terminal, and wherein the amplifier further comprises a third Nch enhancement type transistor and a fourth Nch enhancement type transistor, wherein a gate of the third Nch enhancement type transistor is connected with a gate of the fourth Nch enhancement type transistor.

4. The differential signal receiver according to claim 3, wherein a drain of the fourth Nch enhancement type transistor is connected to a drain of a Pch enhancement type transistor.

* * * * *